United States Patent

Carter et al.

[15] 3,662,225

[45] May 9, 1972

[54] MULTI-PRINTED CIRCUIT ASSEMBLY

[72] Inventors: Robert W. Carter, Bayonne; Steve Chichanowski; Frances Chichanowski, both of Dayton, all of N.J.

[73] Assignee: Qicsys Systems, Inc., Dayton, N.J.

[22] Filed: Jan. 9, 1970

[21] Appl. No.: 1,615

[52] U.S. Cl. ........................317/118, 317/101 D, 339/17 M, 317/101 CB

[51] Int. Cl. ....................................H02k 7/16, H05k 11/14

[58] Field of Search ...........174/68.5, DIG. 3; 317/99, 101 R, 317/101 CB, 101 CM, 101 D, 101 DH, 120, 118, 101 C, 101 CC; 339/17 LM, 17 N, 17 M; 338/312, 313, 332, 162, 166

[56] References Cited

UNITED STATES PATENTS

| | | | |
|---|---|---|---|
| 2,928,555 | 3/1960 | Childs | 317/101 X |
| 3,057,672 | 10/1962 | Morita | 317/101 X |
| 3,147,402 | 9/1964 | Hochstetler | 174/68.5 X |
| 3,334,395 | 8/1967 | Cook | 174/68.5 X |
| 3,340,440 | 9/1967 | Minter | 174/68.5 X |
| 3,417,294 | 12/1968 | Steidlitz | 174/68.5 X |
| 3,432,796 | 3/1969 | Reimer | 174/68.5 X |
| 3,437,882 | 4/1969 | Cayzar | 174/68.5 X |
| 3,496,634 | 2/1970 | Kurtz | 174/68.5 X |
| 3,451,118 | 6/1969 | Badini | 317/101 CC |
| 3,325,766 | 6/1967 | Kolb | 174/DIG. 3 |

*Primary Examiner*—Laramie E. Askin
*Assistant Examiner*—Gerald F. Tolin
*Attorney*—Auslander & Thomas

[57] ABSTRACT

An electronic system modular assembly. A plurality of printed circuit boards including sockets for integrated circuits are mounted on a plurality of support boards which are slidably connected to a housing. Modules are formed of individual of groups of printed circuit boards or by complete support boards. Access to any module is achieved by sliding the support boards out from the housing.

2 Claims, 15 Drawing Figures

INVENTORS
ROBERT W. CARTER
STEVE CHICHANOWSKI
FRANCES CHICHANOWSKI
BY Auslander + Thomas
ATTORNEYS

INVENTORS
ROBERT W. CARTER
STEVE CHICHANOWSKI
BY FRANCES CHICHANOWSKI

ATTORNEYS

INVENTORS
ROBERT W. CARTER
STEVE CHICHANOWSKI
BY FRANCES CHICHANOWSKI

Amelarden + Thomas

ATTORNEYS

MULTI-PRINTED CIRCUIT ASSEMBLY

BACKGROUND OF THE INVENTION

This invention relates to an electronic system and, more particularly to a modular approach in assembling the system.

With the advent of integrated circuits, the design and arrangement of electronic systems has been vastly changed. In particular, integrated circuits are capable of housing a great number of independent electronic circuits compactly and may contain several separate sub-systems, each a functional unit, of a larger electronic system. Access to points in the electronic circuits housed in the integrated circuit is attained by a plurality of external take-off leads connected to the above-mentioned circuit points.

Printed circuit boards advantageously are utilized with integrated circuits by placing the integrated circuit external leads in receptacles in a socket connected to the board. Electrical contact is made in the receptacle between the leads and contact members. Conductive strips are coated on the printed circuit board between the contact members and respective electrical terminals. These terminals are spaced along the length of the board, while the socket generally is located in the middle of the spaced terminals. The reliability of printed circuit boards has been found to be greater than prior methods of electrically connecting components in an electronic system.

Integrated circuits have enabled a modular approach to be utilized when assembling electronic systems but access to particular modules in the system is often difficult to achieve. The arrangements of sub-systems, as found in the prior art, tend to hinder serviceability of the system because one module of the system is not easily reached or replaced without affecting the other portions of the system.

As stated above, the conductive strips coated to the bottom surface of the printed circuit board often cause significant "-cross-talk" between the conductive strips located near each other. This problem can become significant at high frequencies where the "cross-talk" problem often interferes with the reliability and operation of the electronic system.

In the prior art, the terminals on the printed circuit board have tended to be somewhat unreliable in performance. Generally, these terminals are attached to the printed circuit board by a screw and nut arrangement in which the screw is threaded through a hole in a base member of the terminal and attached to a nut located underneath the printed circuit board which contacts the conductive strip. Frequently, the screw and nut connections become loose and the integrity of the electrical path is often poor. Such unreliable connections cannot be tolerated in sophisticated electronic hardware and to this end, the prior art method of attaching the terminal on the printed circuit board to the conductive strip is unsatisfactory.

An object of the present invention is to provide an improved electronic system utilizing a modular assembly.

Another object of the present invention is to provide an improved modular assembly where access to each module is more easily achieved.

Still another object of the present invention is to provide an electronic system whose assembly is modular at every level.

Another object of the present invention is to provide a modular assembly utilizing printed circuit boards and substantially eliminate "cross-talk" between the conductive strips.

Still another object of the present invention is to provide a modular assembly providing improved reliability for the electrical connection at the terminals of the printed circuit board.

Another object of the present invention is to provide a printed circuit board with terminals more firmly held in place.

Still another object of the present invention is to provide an improved assembly for the conductive strips.

Other objects, advantages and features of the present invention will become more apparent in the following description.

SUMMARY OF THE INVENTION

In accordance with the principles of the present invention, the above objects are accomplished by providing a modular assembly comprising a plurality of printed circuit boards with each printed circuit board containing at least one socket including contacts, and a plurality of terminals, means to electrically connect the contacts to the plurality of terminals, means to mount a plurality or set of printed circuit boards to one side of a support board, means to attach at least one edge of the support board to a binding panel, means to attach a plurality of support boards to the binding panel by attaching at least one edge of the plurality of support boards to the binding panel, and means to make electrical connections between a printed circuit board mounted on one support board to another printed circuit board mounted on another support board. In this manner, a totally modular assembly is achieved permitting easy access to any module.

The support boards generally comprising a metallic material for shielding purposes and is generally mounted on insulating material hinged to the binding panel which is slidably attached to a housing and is capable of being slid out from the housing. The support boards which are hinged on one of their edges to the binding panel are easily rotated about the hinge to permit easy access to the mounted printed circuit boards.

In accordance with the modular approach of the present invention, integrated circuits are placed in the sockets of the printed circuit board and each integrated circuit may easily be replaced as may each printed circuit board and, in fact, an entire support board. With relatively complex electronic systems, four to eight support boards may be utilized with each containing between 10 and 20 printed circuit boards. Each printed circuit board may contain four integrated circuits and thus, a relatively complex system may be easily assembled.

In accordance with another feature of the present invention, a laminated conductor member is utilized to connect contacts in the sockets to their respective terminals. Each electroconductive layer is separated by a layer of insulating material, and in this manner, the cross-talk between the conductive strips found prior art printed circuit boards is substantially eliminated. To further minimize the cross-talk problem, a shielding layer may also be connected between each conducting layer.

Frequently, with prior art modular assembly layouts the wiring between the printed circuit boards and the support boards is often complex and cumbersome leading to significant additional "cross-talk" problems. Further, the maze of wiring is often difficult to follow hindering its serviceability. In accordance with another principle of the present invention, it has been found that these problems are substantially eliminated by connecting the circuit boards to the support board in columns and rows and making substantially all electrical connections between respective support boards through the first column and first row circuit board. The wiring on circuit boards on each support board is primarily along the columns with the electrical connections between the printed circuit boards being down in one column and up in the next until the first column and first row of the printed circuit board is reached. The electrical connections from this printed circuit board is made through the binding panel and to the circuit board located at the top row and last column of the next support board. The columnar wiring approach is then repeated on each succeeding support board. This layout for connection between support boards minimizes the problems found in prior art approaches.

As stated above, the binding panel is slidably attached to a housing permitting the support boards to be slid out from the housing facilitating access to the support boards and the printed circuit boards connected to each support board. By providing two vertical binding panels connected with a horizontal panel and single horizontal slides on each vertical panel, torque created when the support boards are slid out from the housing is substantially reduced. In this latter embodiment of FIG. 7, second opposite edges of the support boards are attached to the second binding panel by a suitable hook member which is easily released permitting the support boards to be rotated about a hinge connection between the first edge of the support board and the first binding panel. Access to each support board is thus easily attained.

In accordance with still another feature of the present invention, additional shielding between the printed circuit boards on each support board is achieved by fabricating the support board of aluminum. Insulating spacers are connected between the printed circuit boards and the support boards to prevent the aluminum support boards from shorting the conductive strips, and the printed circuit boards stand away from the surface of the support board.

Another principle of the present invention, interconnecting wires, especially for signal frequencies above 100 $MH_z$, may be individually shielded or trunked in small shielded cables. External or internal connections can also be made with electrical isolation from solid state and optical emitters and sensors.

In accordance with still another principle of the present invention, the terminals of the printed circuit boards are more rigidly connected to the boards. In particular, slots are spaced across the printed circuit board. The terminal of the present invention comprises a base member and leg members. The leg members are fitted through the slots in the printed circuit board with the base member abutting the bottom surface of the printed circuit board while the legs project above the top surface. A die is placed over the leg members and causes a portion of the leg members to be split form the remaining leg portion and bent into the top surface of the printed circuit board. The split portion is not broken from the remaining leg portion and when pressed into the top surface of the printed circuit board, forms a very firm attachment for the terminal. Further, the base member of the electrode terminal is dip-soldered to the bottom surface of the printed circuit board further enhancing the attachment between the terminal and board. The reliability of the electrical path between the terminal and its associated contact in the socket is significantly improved over the prior art.

In accordance with another principle of this invention, discrete electrical components (e.g., a resistor) can be crimp or solder connected to wires between female tab connectors and thus inserted into a module.

FIGURES

DETAILED DESCRIPTION

Figures 1, 2, 3, 4, 7:
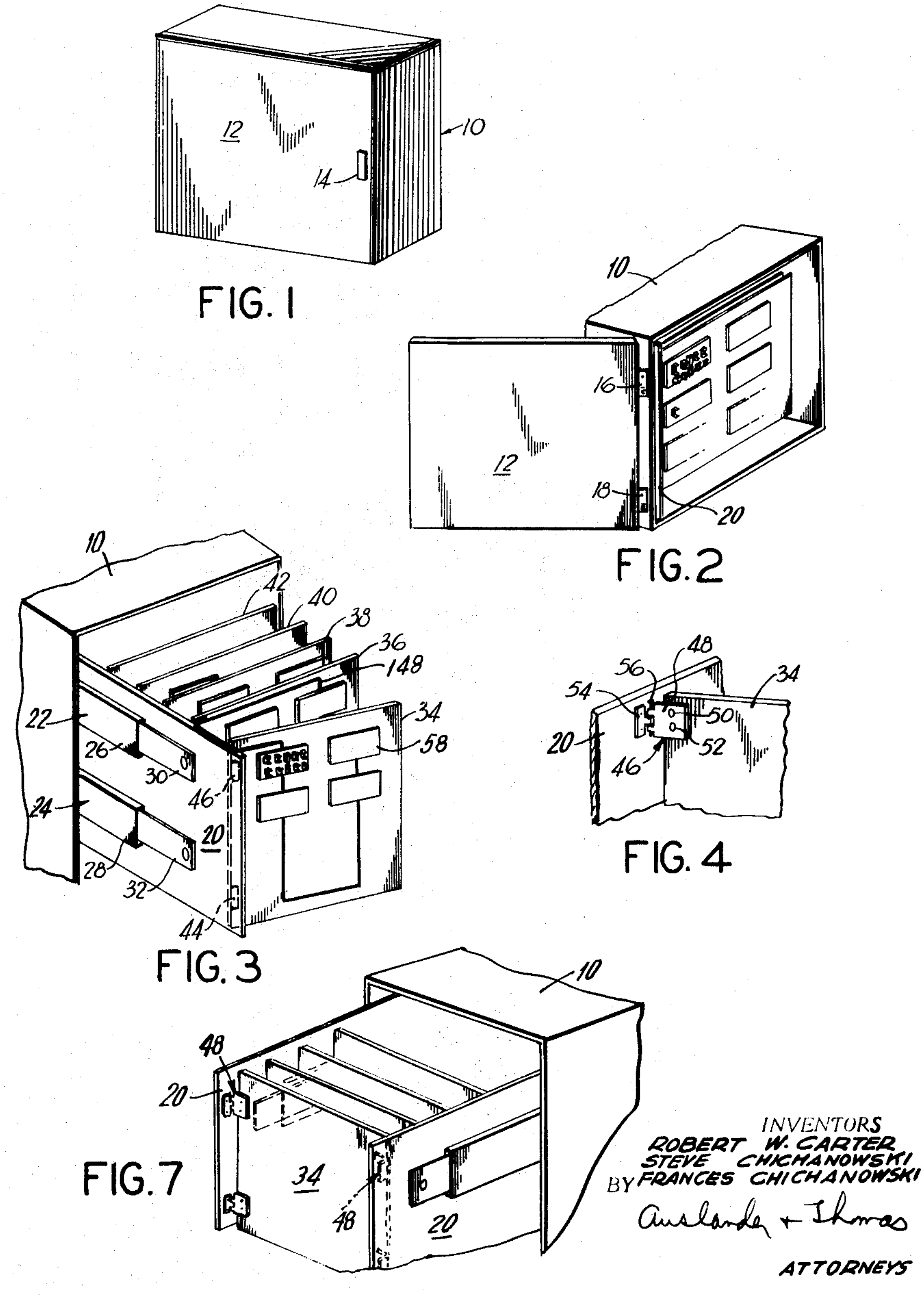
FIG. 1 is a front perspective view of the housing enclosing the modular assembly of the present invention.
FIG. 2 is a front perspective view of the housing with the front cover opened showing the first support boards of the modular assembly of the present invention.
FIG. 3 is a front partial perspective view of the support boards attached to the binding panel with the panel being slideably connected to the housing.
FIG. 4 is a fragmentary partial perspective view of the hinged connection between the support board and binding panel.
FIG. 7 is a front partial perspective view of another embodiment of the present invention utilizing two binding panels with the binding panels slideably connected to the housing.
Figure 5:
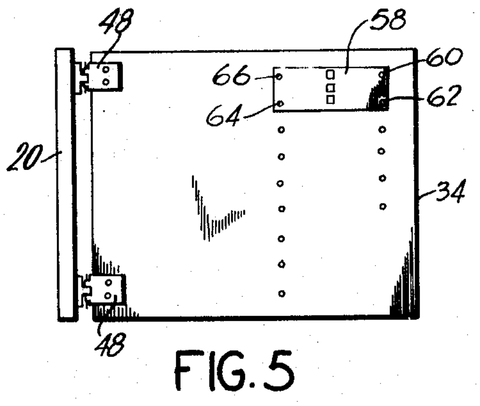
FIG. 5 is a top view of a printed circuit board attached to a support board.

In accordance with the principles of the present invention, the modular assembly, as constructed resembles a book containing a cover and pages attached to a binding.

A housing 10 is substantially box like in shape and includes a front cover 12 with a handle portion 14. Cover 12 is connected to the remainder of the housing by means of hinges 16 and 18 and when opened, permits access to the modular assembly of the present invention. A binding panel 20 is slidably attached to one inner side wall of housing 10 by means of a pair of slides 22 and 24. Slides 22 and 24 comprise base members 26 and 28, respectively, which are fixed to the inner side wall of housing 10. Base members 26 and 28 are slotted and permit a pair of slides 30 and 32 to move in these slots, respectively. Slides 30 and 32 are attached to binding panel 20 enabling it to move in and out of the housing 10.

A plurality of support panels, 34, 36, 38, 40 and 42, generally rectangular in shape, are each connected at one side edge to binding panel 20 by means of hinges. A pair of hinges 44 and 46 connect support board 34 to binding panel 20. Similar hinges are used to attach the other support boards to binding panel 20. Hinges 44 and 46 comprise hinge plates and, as shown in FIG. 4 with respect to hinge 46, a hinge plate 48 is attached to the upper corner of support board 34 by means of a pair of rivets 50 and 52. Hinge plate 48 is pivoted about a pivot member 54 which is attached to binding panel 20 and has associated therewith a removable pin 56 which when removed from its position in pivot 54, permits support plate 34 to be removed from binding panel 20.

When binding panel 20 is moved out of housing 10, access to the support boards is achieved. Each support board is generally constructed in a similar fashion and, therefore, only support board 34 will be more fully described. Support board 34 preferably is made of aluminum for electrical shielding and a plurality of printed circuit boards are attached to the front side of support board 34.

For purposes of illustration, only some printed circuit boards 58 are shown attached to support board 34. Printed circuit boards 58 are shown in more detail in FIGS. 8 through 13. It is to be understood, of course, that any number of printed circuit boards may be mounted on each support board. The printed circuit board is preferably comprised of a non-conductive material such as fiberglass. Two pairs of holes 60 and 62, and 64 and 66 are provided in printed circuit board 58. Aligned holes are also provided in support board 34 to mount printed circuit board 58 thereto. A plurality of additional holes are provided in the support board to enable additional printed circuit boards to be attached.

Figure 6:
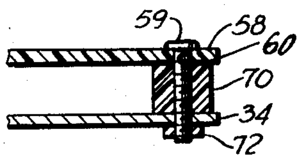
FIG. 6 is a fragmentary end view of the printed circuit board attached to the support board.

One method of mounting printed circuit board 58 to support board 34 is shown in FIG. 6. A screw 59 is inserted from the top of printed circuit board 58 through the hole 60 in printed circuit board 58 and is aligned with a hole in support board 34. The screw 59 is fitted through these two holes while a spacer 70 is placed between the top surface of support board 34 and the bottom surface of printed circuit board 58. Spacer 70 is preferably made of a nonconductive material and for instance, may comprise nylon. A threaded nut 72 is placed on the bottom of screw 59 below the bottom surface of support board 34 and attaches printed circuit board 58 to support board 34. The holes on the other printed circuit boards and the support boards similarly may use a screw, spacer, and nut arrangement for attaching the printed circuit board to the support board. Other arrangements for mounting the printed circuit board to the support board are well known to those of ordinary skill in the art. Fig. 7 adds a second sliding binding panel substantially a mirrow image of the opposing binding panel.

Figure 8:
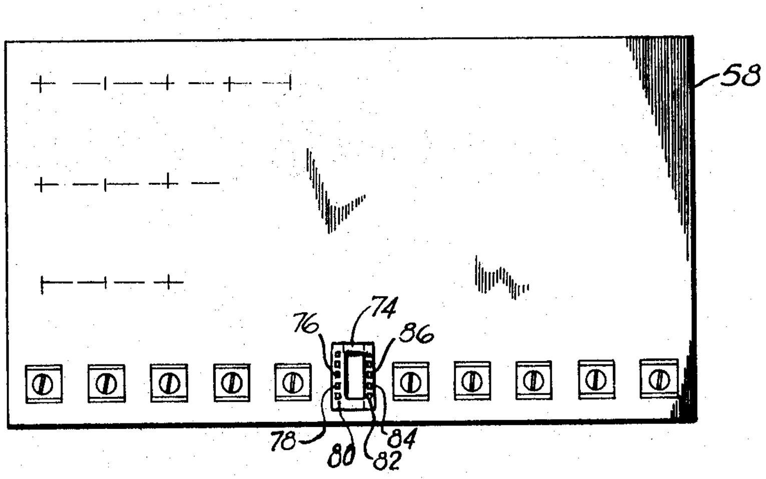
FIG. 8 is a top view of the printed circuit board of the present invention.

Printed circuit boards as utilized in the prior art have found wide applicability for solid state electronics and, in particular, with transistors and integrated circuits. The printed circuit board generally includes an attached socket in which the leads of a transistor or printed circuit board are inserted. Contacts in the socket electrically connect the leads to terminals of the board by conductive strips plated to the bottom surface of the printed circuit board between the contacts and terminals. As shown in FIG. 8, a socket 74 is attached to printed circuit board 58 by glue, or other arrangements known to those of ordinary skill in the art. A plurality of similar sockets may be attached to the printed circuit board but, for purposes of illustration, only one such socket will be described. The socket, generally, is fabricated of electrically insulating rigid material and may be plastic. A plurality of receptacles 76, 78, 80, 82, 84 and 86 are adapted to receive leads of an integrated circuit 88 which is placed on top of socket 74. A pair of electrical contacts is housed in each receptacle to receive these leads. As illustratively shown in FIG. 13, the contacts in socket 74 are connected to remote terminals 90, 92, 94, 96, 98, 100, 102, 104, 106 and 108 by means of conductive strips 109, plated to the bottom surface of printed circuit board 58. The conductive strips 109 are plated to the bottom surface in such a manner as to define separate and independent electrical paths.

Figure 9:
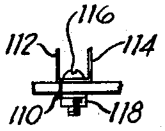
FIG. 9 is a fragmentary end view of printed circuit board shown in FIG. 8.
Figure 10:
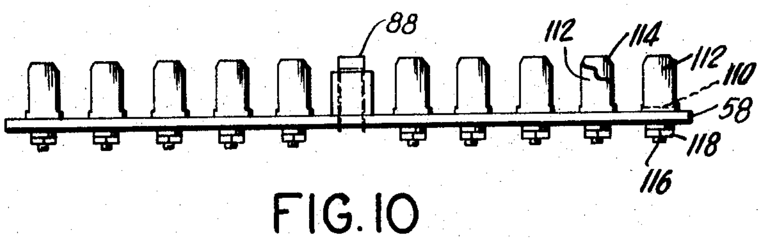
FIG. 10 is a side view of the printed circuit board shown in FIG. 8.

The terminals permit external connections to be made to the printed circuit board and to the integrated circuit leads connected to the respective terminals. FIG. 9 illustrates one method of connecting a terminal to the printed circuit board in which the terminal comprises a base member 110 and two leg members 112 and 114. A hole is provided through base member 110 and a screw 116 inserted there-through and through an aligned hole in printed circuit board 58 to which a nut 118 is attached in order to attach the terminal to the printed circuit board. A terminal suitable for connection to AMP type connectors is frequently utilized with printed circuit boards.

Figure 11:
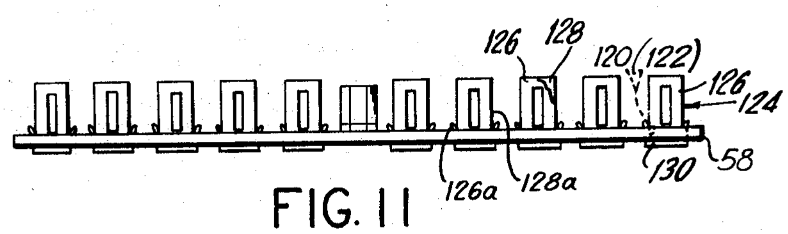
FIG. 11 is a side view of the printed circuit board shown in FIG. 8 illustrating the terminals of the present invention connected to the board by a preferred means.
Figure 12:
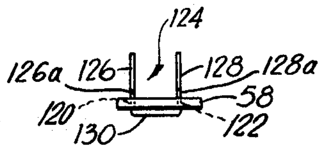
FIG. 12 is a partial end view of the terminal and printed circuit board shown in FIG. 11.
Figure 13:
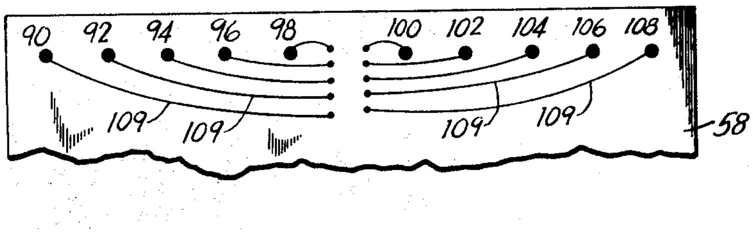
FIG. 13 is a bottom view of the printed circuit board shown in FIGS. 5 and 8 illustrating the conductive strips.

In accordance with a feature of the present invention, the method of connecting the terminal to the printed circuit board has been improved and is shown in FIGS. 11 and 12. In the prior art, and as described above, the screw and nut arrangement for connecting the terminal to the printed circuit board was often unsuitable because frequently it became loose during repeated use and caused an open path in the electrical between a socket contact and its associated terminal. In accordance with the principles of the present invention, the printed circuit board is provided with a series of through-slots 120 and 122. Additional similar through-slots are made in the printed circuit board, and only slots 120 and 122 will be described.

A terminal 124 comprising a pair of leg members 126 and 128 and a base member 130 is inserted through the slots by pushing leg members 126 and 128 through slots 120 and 122, respectively, and a portion **126*a* and 128*a* on the sides of the leg members is then split from the remaining center portion of the leg member and bent down to press against the top surface of printed circuit board 58. In this manner, a relatively rigid connection is achieved between the terminal 124 and the printed circuit board 58, and the problems associated with a screw and nut arrangement found in the prior art are substantially eliminated. Further, the base member 130 is dip soldered for both electrical and structural purposes to the bottom surface of circuit board 58** which further enhances the connection between the terminal and printed circuit board.

Figure 14:
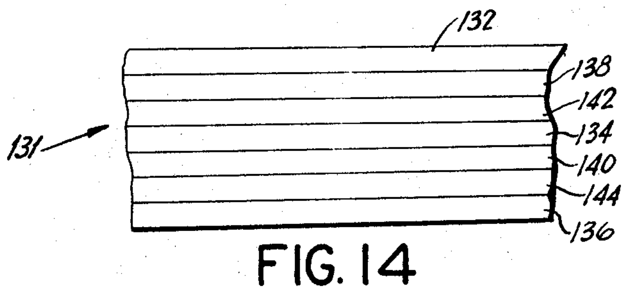
FIG. 14 is a side view of the laminated conductor of the present invention.
Figure 15:
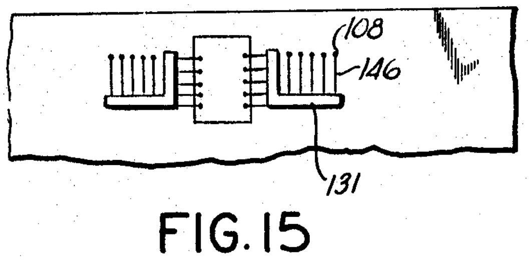
FIG. 15 is a bottom view of a printed circuit board utilizing the laminated conductor shown in FIG. 14 for connecting the socket to the terminals of the board.

As still another feature of the present invention, an improved conductive assembly is provided between the contacts in the socket 74 and their respective terminals (110, 112, 114). In the prior art, often significant cross-talk occurred between the conductive strips, as described above. In accordance with a feature of the present invention, a laminated conductor assembly is provided as shown in FIG. 14 for connection between the contacts and their respective terminals. In particular, the laminated conductor assembly 131 comprises layers of electroconductive material 136 and 142 with insulating layer 134 inserted between the electroconductive layers 136 and 142. To further minimize cross-talk, shield layers 140 and 132 are also inserted. Shield layers 140 and 132 are connected to a point of common ground and in this manner will effectively minimize the cross-talk between the electroconductive layers 142 and 136. It may be understood a number of layers may be so provided depending on the number of terminals and contacts to be connected. In FIG. 15, the electroconductive laminated assembly shown in FIG. 14 is shown connected between a plurality of socket contacts and a plurality of associated terminals. Each electroconductive layer assembly has associated therewith a lead as exemplified by lead 146 which extends from an electroconductive layer to its associated terminal 108.

It has been frequently found with modular assemblies that wiring between respective support panels tends to be extremely complex and often increases the amount of "cross-talk" and other types of interference between respective interconnecting leads. In accordance with the principles of the present invention, it has been found much of these problems may be substantially eliminated by electrically wiring each support board in a columnar direction. As shown in FIG. 3, the electrical wiring between printed circuit boards on support board 34 is brought down the last column of printed circuit boards and up the next column. The electrical connections between support boards 34 and 36 are made through the printed circuit board located at the first column and first row of support board 34 and through binding panel 20. In this manner, all connections between the support boards are made from the first column and first row printed circuit board and this minimizes the cross-talk and related interference found in the prior art. At support board 36, the electrical leads in cable 148 are first connected to the printed circuit board located in the first row and last column thereof and the columnar approach to the electrical wiring between circuit boards on each support board is again followed.

The above embodiments which have been described are understood to be merely illustrative of the various principles of the present invention and should not be construed in a limiting sense. The embodiments were described in detail merely by way of example and were not intended as a limitation to the spirit and scope of the protection obtained for the invention described in this patent application.

Having thus described certain forms of the invention in some detail, what is claimed is:

1. A modular assembly comprising a plurality of support boards, a plurality of printed circuit boards mounted on said plurality of support boards, including at least one printed circuit board on at least one of said plurality of support boards and including at least two printed circuit boards on another of said plurality of support boards, each printed circuit board containing a plurality of components and a plurality of terminals, means electrically connecting said plurality of components to said plurality of terminals, means mounting at least said one printed circuit board to one side of at least said one of said plurality of support boards and means mounting at least said two printed circuit boards on said another of said plurality of support boards, a first binding panel, means attaching at least one edge of each of said support boards to said first binding panel, means attaching said plurality of said support boards to said first binding panel by attaching at least one edge of each of said plurality of support boards to said first binding panel, means electrically connecting said components on at least one of said printed circuit boards mounted on said one of said plurality of support boards to at least one of said two printed circuit boards on said another of said plurality of support boards, said components each including an integrated circuit, a plurality of socket means each comprising a plurality of separate contacts, said plurality of socket means being attached to each of said printed circuit boards, each socket means receiving and holding a plurality of separate leads of an integrated circuit, each of said contacts being contactable of at least one of said leads, and said plurality of terminals are arrayed in column and row manner on each printed circuit board with said plurality of sockets located at approximately the middle column of each printed circuit board, said modular assembly further comprising laminated conductor means including contact leads with each lead connecting with a predetermined one of said socket contacts and including terminal leads with each lead connecting with a predetermined one of said terminals, with the number of said laminated conductors approximately equal to the number of said terminals connected to the separate electrical contacts in each socket, and in which said laminated conductor means comprises a plurality of electroconductive layers with an electrically shielding layer and an electrically insulating layer connected between each electroconductive layer and an opposing shielding layer.

2. A modular assembly comprising a plurality of support boards, a plurality of printed circuit boards mounted on said plurality of support boards, including at least one printed circuit board on at least one of said plurality of support boards and including at least two printed circuit boards on another of said plurality of support boards, each printed circuit board containing a plurality of components and a plurality of terminals, means electrically connecting said plurality of components to said plurality of terminals, means mounting at least said one printed circuit board to one side of at least said one of said plurality of support boards and means mounting at least said two printed circuit boards on said another of said plurality of support boards, a first binding panel, means attaching at least one edge of each of said support boards to said first binding panel, means attaching said plurality of said support boards to said first binding panel by attaching at least one edge of each of said plurality of support boards to said first binding panel, means electrically connecting said components on at least one of said printed circuit boards mounted on said one one of said plurality of support boards to at least one of said two printed circuit boards on said another of said plurality of support boards, said components each including an integrated circuit, a plurality of socket means each comprising a plurality of separate contacts, said plurality of socket means being attached to each of said printed circuit boards, each socket means receiving and holding a plurality of separate leads of an integrated circuit, each of said contacts being contactable of at least one of said leads, a second binding panel, means attaching at least a second edge of each of said plurality of support boards to said second binding panel where said second edge is opposite said first edge, a housing, slide means attaching said first and said second binding panels to said housing, and a hook means attaching at least one edge of each of said plurality of support boards to said second binding panel whereby when said support boards are slid out from said housing said hook members are removed and release one edge of its associated support board from said second binding panel permitting access to said support board.

* * * * *